United States Patent
Noda

(10) Patent No.: US 11,075,213 B2
(45) Date of Patent: Jul. 27, 2021

(54) SEMICONDUCTOR MEMORY DEVICE AND MANUFACTURING METHOD FOR SAME

(71) Applicant: TOSHIBA MEMORY CORPORATION, Tokyo (JP)

(72) Inventor: Kosei Noda, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/120,405

(22) Filed: Sep. 3, 2018

(65) Prior Publication Data
US 2019/0296032 A1 Sep. 26, 2019

(30) Foreign Application Priority Data
Mar. 20, 2018 (JP) ............................ JP2018-052418

(51) Int. Cl.
| | | |
|---|---|---|
| *H01L 27/11551* | (2017.01) | |
| *H01L 27/11529* | (2017.01) | |
| *H01L 27/1157* | (2017.01) | |
| *H01L 27/11582* | (2017.01) | |
| *H01L 27/11578* | (2017.01) | |

(52) U.S. Cl.
CPC .... *H01L 27/11551* (2013.01); *H01L 27/1157* (2013.01); *H01L 27/11529* (2013.01); *H01L 27/11578* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,431,419 B2 | 8/2016 | Fukuzumi et al. | |
| 10,256,252 B1* | 4/2019 | Kanazawa | H01L 27/11582 |
| 2011/0309431 A1* | 12/2011 | Kidoh | H01L 27/11573 |
| | | | 257/324 |
| 2015/0221667 A1* | 8/2015 | Fukuzumi | H01L 27/11582 |
| | | | 257/314 |
| 2015/0294978 A1* | 10/2015 | Lu | H01L 27/1157 |
| | | | 438/269 |
| 2015/0380418 A1* | 12/2015 | Zhang | H01L 27/11529 |
| | | | 257/326 |
| 2016/0322374 A1* | 11/2016 | Sano | H01L 21/31111 |
| 2016/0322381 A1* | 11/2016 | Liu | H01L 27/11573 |
| 2017/0148800 A1* | 5/2017 | Nishikawa | H01L 27/1157 |
| 2018/0269277 A1* | 9/2018 | Miyagawa | H01L 29/04 |
| 2018/0277596 A1* | 9/2018 | Mori | H01L 27/249 |
| 2018/0323213 A1* | 11/2018 | Arai | H01L 27/11582 |

(Continued)

*Primary Examiner* — Grant S Withers
(74) *Attorney, Agent, or Firm* — Kim & Stewart LLP

(57) ABSTRACT

According to one embodiment, semiconductor memory device includes a first conductive layer, a plurality of second conductive layers stacked over the first conductive layer in a first direction, a memory pillar extending in the plurality of second conductive layers in the first direction, and a first layer extending from the first conductive layer through a portion of the plurality of second conductive layers in the first direction in contact with a the plurality of second conductive layers, the first layer including a first portion having a first cross section in the plane of second and third directions that are perpendicular to each other and to the first direction, and a second portion having a second cross section, different from the first cross section, in the plane of the second and third directions.

17 Claims, 17 Drawing Sheets

(56) References Cited

U.S. PATENT DOCUMENTS

2018/0331118 A1* 11/2018 Amano ................ H01L 23/485
2019/0067312 A1*  2/2019 Arisumi ........... H01L 27/11568
2019/0296034 A1*  9/2019 Nagashima ....... H01L 21/76224
2019/0378852 A1* 12/2019 Baek ................ H01L 21/76805

* cited by examiner

SEMICONDUCTOR MEMORY DEVICE AND MANUFACTURING METHOD FOR SAME

CROSS-REFERENCE TO RELATED APPLICATION

This application is based upon and claims the benefit of priority from Japanese Patent Application No. 2018-052418, filed Mar. 20, 2018, the entire contents of which are incorporated herein by reference.

FIELD

Embodiments described herein relate generally to a semiconductor memory device and a manufacturing method for the same.

BACKGROUND

As a semiconductor memory device, a NAND-type flash memory having memory cells arranged three-dimensionally is known.

DETAILED DESCRIPTION

Embodiments provide a semiconductor memory device and a manufacturing method for the same that can ensure high reliability.

In general, according to one embodiment, a semiconductor memory device includes a first conductive layer, a plurality of second conductive layers stacked over the first conductive layer in a first direction, a memory pillar extending in the plurality of second conductive layers in the first direction, and a first layer extending from the first conductive layer through a portion of the plurality of second conductive layers in the first direction in contact with a the plurality of second conductive layers, the first layer including a first portion having a first cross section in the plane of second and third directions that are perpendicular to each other and to the first direction, and a second portion having a second cross section, different from the first cross section, in the plane of the second and third directions.

Embodiments will be described hereinafter with reference to the drawings. In the following description, constituent elements having an identical function and an identical configuration are denoted by the same reference sign. Furthermore, each embodiment exemplarily shows a device and a method for embodying one or more technical features of the embodiment.

1. Embodiment

A semiconductor memory device in an embodiment will be described. As the semiconductor memory device, a three-dimensional stacked NAND-type flash memory having memory cell transistors (hereinafter, also referred to as "memory cells") stacked above a semiconductor substrate will be described by way of example.

1.1. Configuration of Semiconductor Memory Device

Figure 1:
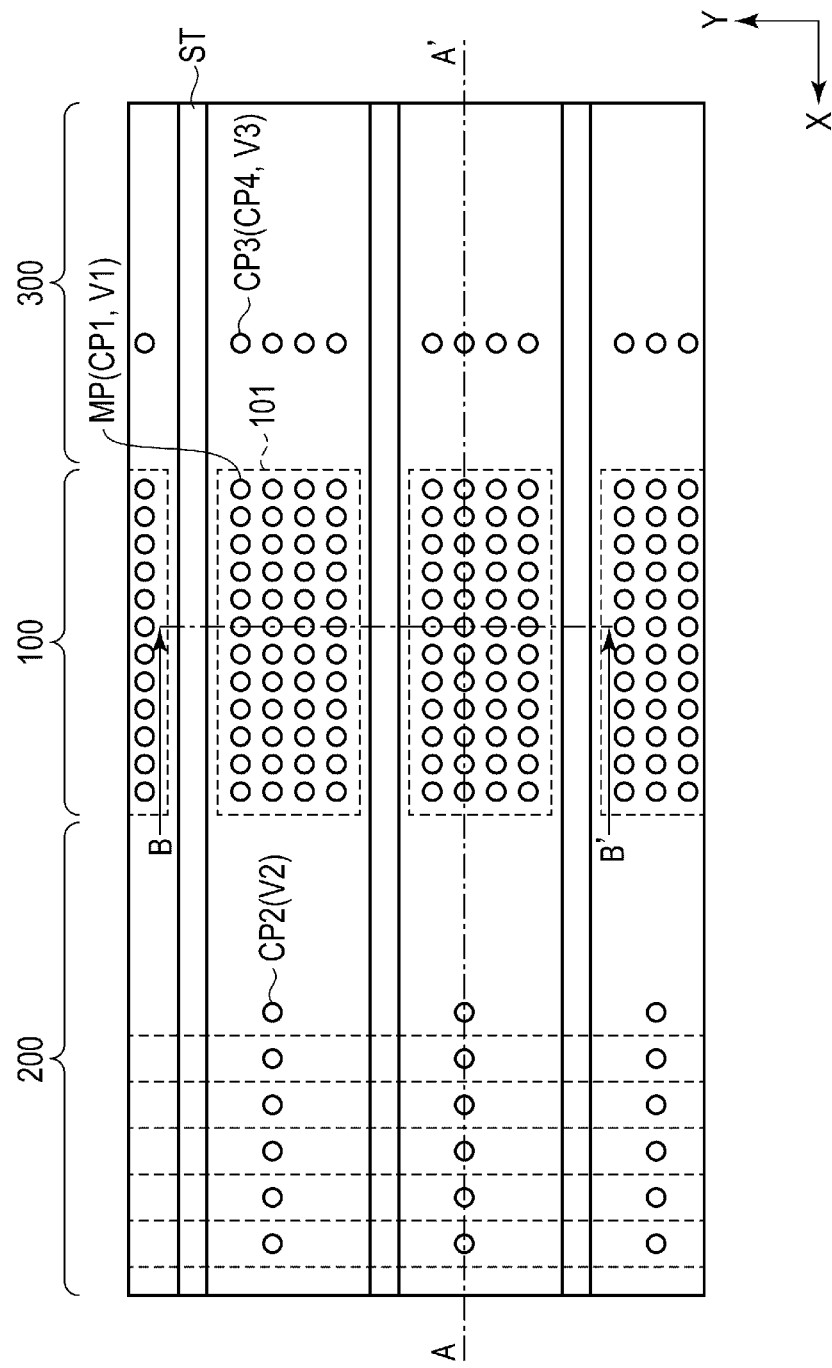
FIG. 1 is a plan view illustrating a configuration of a semiconductor memory device in an embodiment.
Figure 2:
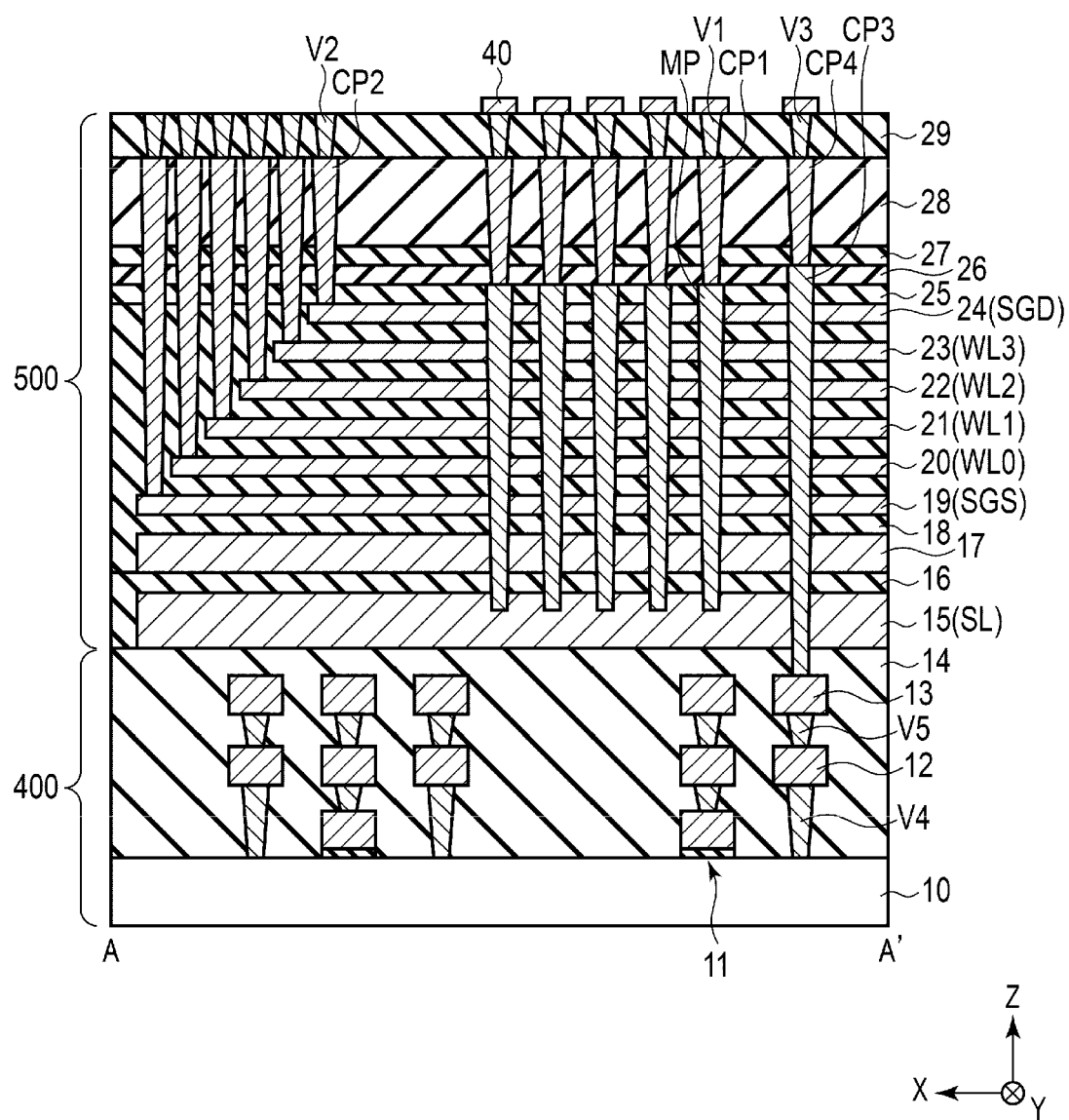
FIG. 2 is a cross-sectional view taken along a line A-A' of FIG. 1.
Figure 3:
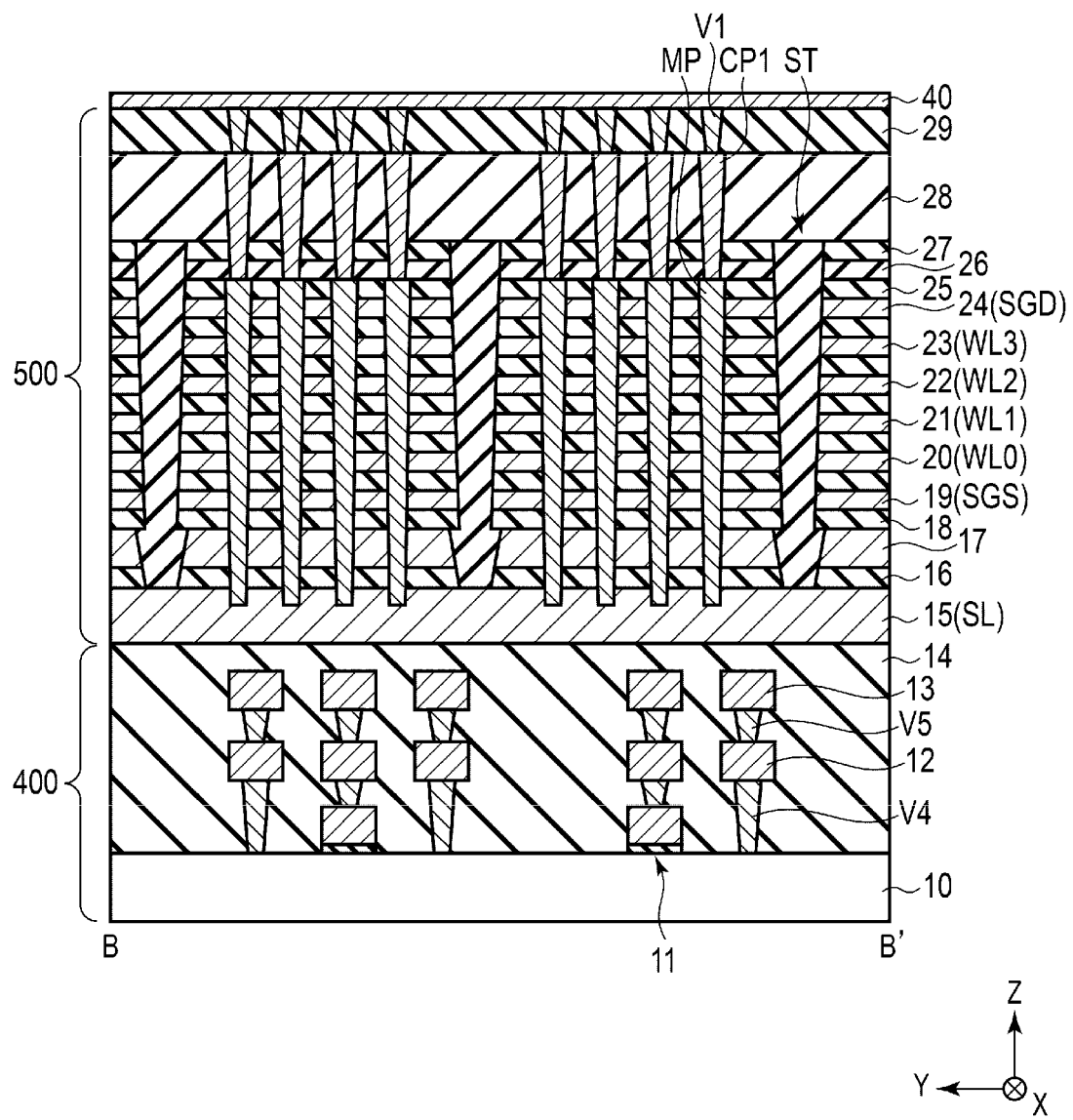
FIG. 3 is a cross-sectional view taken along a line B-B' of FIG. 1.

FIG. 1 is a plan view illustrating a configuration of a semiconductor memory device according to an embodiment. FIG. 2 is a cross-sectional view taken along a line A-A' of FIG. 1. FIG. 3 is a cross-sectional view taken along a line B-B' of FIG. 1. In FIG. 1, it is defined that two directions orthogonal to each other and parallel to a semiconductor substrate surface are an X direction and a Y direction, and that a direction orthogonal to the X direction and the Y direction is a Z direction. It is noted that bit lines are omitted in FIG. 1.

As shown in FIG. 1, the semiconductor memory device has a memory cell array region 100, a lead region 200, and a contact region 300.

The memory cell array region 100 includes a plurality of memory blocks 101. The plurality of memory blocks 101 extend in the X direction and are spaced from one another in the Y direction. The plurality of memory blocks 101 are similar in configuration.

Each of the memory blocks 101 has a plurality of memory pillars MP. The plurality of memory pillars MP are arranged in a matrix, that is, regularly spaced in the X direction and the Y direction. The number of memory pillars MP may be any number. As shown in FIGS. 2 and 3, each memory pillar MP is connected to a conductive layer 40 via a contact CP1 and a via V1. The conductive layer 40 functions as a bit line BL.

Slits (isolation layers) ST extending in the X direction are provided between the plurality of memory blocks 101. The slits ST isolate the memory blocks 101 from one another. The number of slits ST may be any number required to.

The lead region 200 has a plurality of contacts CP2 connected to word lines to be described later. The contacts CP2 adjacent to each memory block 101 are spaced from one another in the X direction. As shown in FIG. 2, the contacts CP2 are connected to vias V2.

The contact region 300 has a plurality of through contacts CP3 connected to a peripheral circuit to be described later. As shown in FIG. 2, the through contacts CP3 are connected to vias V3 via contacts CP4.

As shown in FIGS. 2 and 3, a peripheral circuit region 400 and a memory circuit region 500 are provided on a semiconductor substrate, for example, silicon substrate 10. The peripheral circuit region 400 includes the peripheral circuit exercising control over writing, reading, and erasing of data to or from each memory cell. The peripheral circuit has CMOS circuits 11 each including an n-channel-type MOS transistor (hereinafter, referred to as "nMOS transistor") and a p-channel-type MOS transistor (hereinafter, referred to as "pMOS transistor"). The plurality of memory pillars MPs described above, a plurality of word lines WL0 to WL3, a source line SL, and bit lines BL are provided in the memory circuit region 500. It is assumed hereafter that when a word line is denoted by WL, the word line represents each of the word lines WL0 to WL3. While a case in which the number of word lines is four is shown herein, the number of word lines may be any number.

While a configuration such that the memory circuit region 500 is provided on the peripheral circuit region 400 is shown by way of example, the configuration of the semiconductor memory device is not limited to this configuration. Alternatively, the semiconductor memory device may be configured such that the peripheral circuit region 400 is provided on the memory circuit region 500, or that the peripheral circuit region 400 and the memory circuit region 500 are aligned horizontally.

A cross-sectional structure of the semiconductor memory device taken along line A-A' will be described with reference to FIG. 2. The CMOS circuits 11 each including, for example, the nMOS transistor and the pMOS transistor and vias V4 are provided on the silicon substrate 10. The vias V4 are each connected to sources, drains, or gates of the nMOS transistor and the pMOS transistor.

A conductive layer (for example, an interconnection or a pad) 12 is provided on each via V4. A via V5 is provided on the conductive layer 12. A conductive layer (for example, an interconnection or a pad) 13 is provided on the via V5. An insulating layer 14 is provided around the CMOS circuits 11, the conductive layers 12 and 13, and the vias V4 and V5 on and over the silicon substrate 10.

A conductive layer 15 is provided on the insulating layer 14. The conductive layer 15 functions as a source line SL.

An insulating layer 16 is provided on the conductive layer 15. A conductive layer 17 is provided on the insulating layer 16.

A plurality of insulating layers 18 and a plurality of conductive layers 19 to 24 are alternately stacked on the conductive layer 17. The conductive layers 17 and 19 to 24 extend in the X direction. The conductive layers 17 and 19 function as source-side select gate lines SGS. The conductive layers 20 to 23 function as the plurality of word lines WL0 to WL3, respectively. The conductive layer 24 functions as a drain-side select gate line SGD.

An insulating layer 25 is provided on the conductive layer 24. The columnar memory pillars MP extending in the Z direction are provided in the plurality of insulating layers 16 and 18, the plurality of conductive layers 17 and 19 to 24, and the insulating layer 25. One end of each memory pillar MP is connected to the conductive layer 15 (source line SL) while the other end of the memory pillar MP reaches an upper surface of the insulating layer 25. That is, each memory pillar MP extends from the upper surface of the insulating layer 25, through the insulating layer 25, the drain-side select gate line SGD, the plurality of insulating layer 18, the plurality of word lines WL0 to WL3, the source-side select gate line SGS, and the insulating layer 16, to the source line SL. Details of the memory pillar MP will be described later.

Insulating layers 26, 27, and 28 are provided on the memory pillars MPs and the insulating layer 25 in this order. In the memory cell array region 100, the contacts CP1 extending in the Z direction are provided in the insulating layers 26 to 28. Each contact CP1 extends from an upper surface of the insulating layer 28 and reaches each memory pillar MP. Each contact CP1 is connected to each memory pillar MP.

In the lead region 200, the plurality of contacts CP2 extending in the Z direction are provided in the insulating layers 18 and 25 to 28. The individual ones of the contacts CP2 extend from the upper surface of the insulating layer 28 and reach individual ones of the conductive layers 19 to 24, respectively. The contacts CP2 are connected to the source-side select gate line SGS, the word lines WL0 to WL3, and the drain-side select gate line SGD, respectively.

In the contact region 300, the through contacts CP3 extending in the Z direction are provided in the insulating layers 14, 16, 18, 25, and 26 and the conductive layers 15, 17, and 19 to 24. The through contacts CP3 extend from an upper surface of the insulating layer 26 and reach the conductive layer 13. The through contacts CP3 are connected to the conductive layer 13. The contacts CP4 extending in the Z direction are provided in the insulating layers 27 and 28. The contacts CP4 extend from the upper surface of the insulating layer 28 and reach the through contacts CP3. The contacts CP4 are connected to the through contacts CP3.

Furthermore, an insulating layer 29 is provided on the contacts CP1, CP2, and CP4 and the insulating layer 28. In the memory cell array region 100, the vias V1 extending in the Z direction are provided in the insulating layer 29. Each via V1 extends from an upper surface of the insulating layer 29 and reaches one contact CP1. The via V1 is connected to the contact CP1. The via V1 is further connected to one of the conductive layers 40 (bit line BL).

In the lead region 200, the vias V2 extending in the Z direction are provided in the insulating layer 29. Each via V2 extends from the upper surface of the insulating layer 29 and reaches one contact CP2. The via V2 is connected to the contact CP2.

In the contact region 300, the vias V3 extending in the Z direction are provided in the insulating layer 29. Each via V3 extends from the upper surface of the insulating layer 29 and reaches one contact CP4. The via V3 is connected to the contact CP4.

A cross-sectional structure of the semiconductor memory device taken along a line B-B' will next be described with reference to FIG. 3. Internal structures of the peripheral circuit region 400 and the memory blocks 101 including the memory pillars MP are similar to those shown in FIG. 2. Different structures will be described herein.

As described above, slits ST extending in the X direction are provided between the memory blocks 101. The slits ST isolate the memory blocks 101 from one another. In other words, the slits ST isolate the memory cell array having the memory pillars MP and the conductive layers 17 and 19 to 24. The slits ST each have a two-stage shape (or two-stage structure). Details of the slits ST will be described later. The slits ST each may have a structure such that the overall slit ST has an insulating layer or a structure such that the slit has an insulating layer on an outer side and has a conductive layer inside of the insulating layer.

1.1.1. Details of Memory Pillar MP

Figure 4:
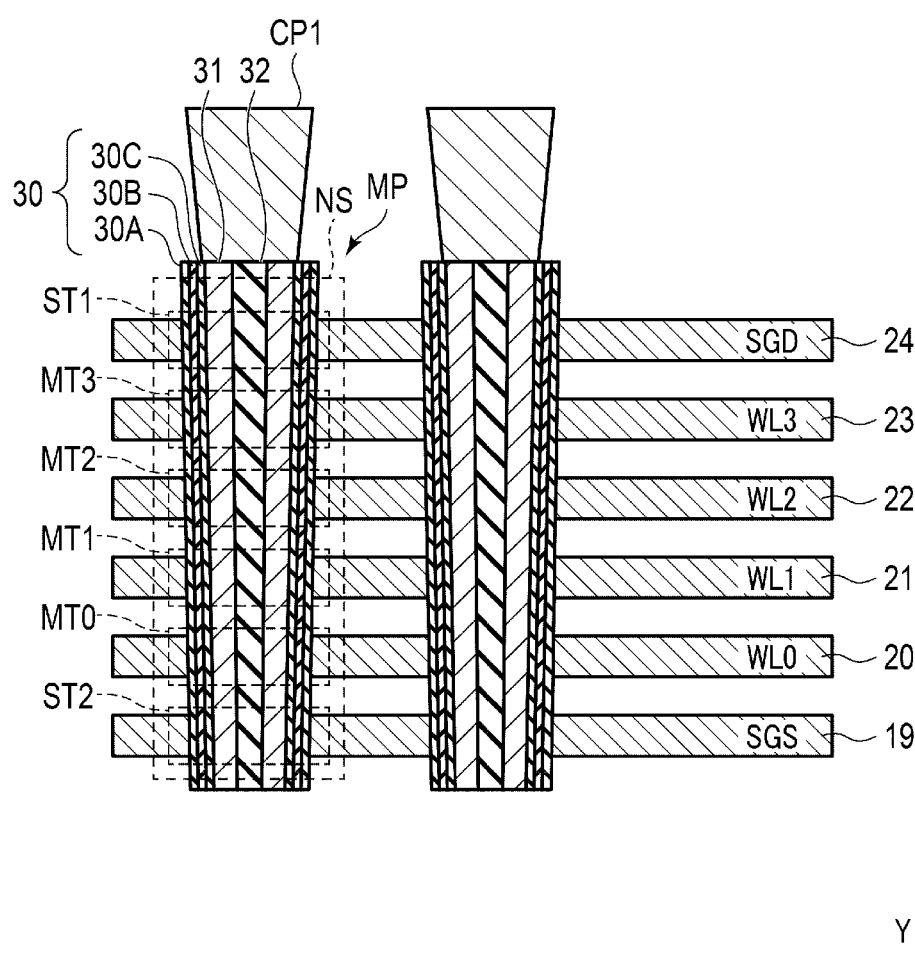
FIG. 4 is a cross-sectional view of memory pillars along a Y direction in the embodiment.

A detailed configuration of the memory pillars MP in the semiconductor memory device of the embodiment will next be described with reference to FIG. 4. FIG. 4 is a cross-sectional view of the memory pillars along the Y direction. In FIG. 4, the insulating layers are omitted.

The memory pillars MP function as NAND strings NS. Each NAND string NS has a select transistor ST1, memory cell transistors MT0 to MT3, and a select transistor ST2.

As shown in FIG. 4, the conductive layer 19 (source-side select gate line SGS), the conductive layers 20 to 23 (word lines WL0 to WL3), and the conductive layer 24 (drain-side select gate line SGD) are spaced from one another in the Z direction. The memory pillars MP penetrate these conductive layers 19 to 24. NAND strings NS are formed in intersecting portions of the conductive layers 19 to 24 with the memory pillars MP.

Each of the memory pillars MP has, for example, a cell insulating layer 30, a semiconductor layer 31, and a core insulating layer 32. The cell insulating layer 30 includes a block insulating layer 30A, a charge storage layer 30B, and a tunnel insulating layer (or a gate insulation layer) 30C. Specifically, the block insulating layer 30A is provided on an inner wall of a memory hole for forming each memory pillar MP. The charge storage layer 30B is provided on an inner wall of the block insulating layer 30A. The tunnel insulating layer 30C is provided on an inner wall of the charge storage layer 30B. The semiconductor layer 31 is provided on an inner wall of the tunnel insulating layer 30C. Furthermore, the core insulating layer 32 is provided inside of the semiconductor layer 31. The core insulating layer 32 includes, for example, a silicon oxide layer.

In such a configuration of the memory pillar MP, a portion where a memory pillar MP intersects the conductive layer 19 (and the conductive layer 17) functions as a select transistor ST2. Portions where a memory pillar MP intersect the conductive layers 20 to 23 function as the memory cell transistors MT0 to MT3, respectively. A portion where the memory pillar MP intersects the conductive layer 24 functions as the select transistor ST1. When a memory cell transistor is denoted by MT, the memory cell transistor MT represents each of the memory cell transistors MT0 to MT7, hereinafter.

The semiconductor layer 31 functions as a channel layer of each of the memory cell transistors MT and the select transistors ST1 and ST2. The semiconductor layer 31 is, for example, a silicon-containing layer.

The charge storage layer 30B functions as a charge storage layer that stores charge injected from the semiconductor layer 31 in each memory cell transistor MT. The charge storage layer 30B includes, for example, a silicon nitride layer.

The tunnel insulating layer 30C functions as an electrical potential barrier at a time of injecting the charge from the semiconductor layer 31 into the charge storage layer 30B or at a time of releasing the charge stored in the charge storage layer 30B to the semiconductor layer 31. The tunnel insulating layer 30C includes, for example, a silicon oxide layer.

The block insulating layer 30A prevents the charge stored in the charge storage layer 30B from diffusing into the conductive layers (word lines WL) 20 to 23. The block insulating layer 30A includes, for example, a silicon oxide layer and a silicon nitride layer.

1.1.2 Configurations of Principal Portions in Embodiment

Figure 5:
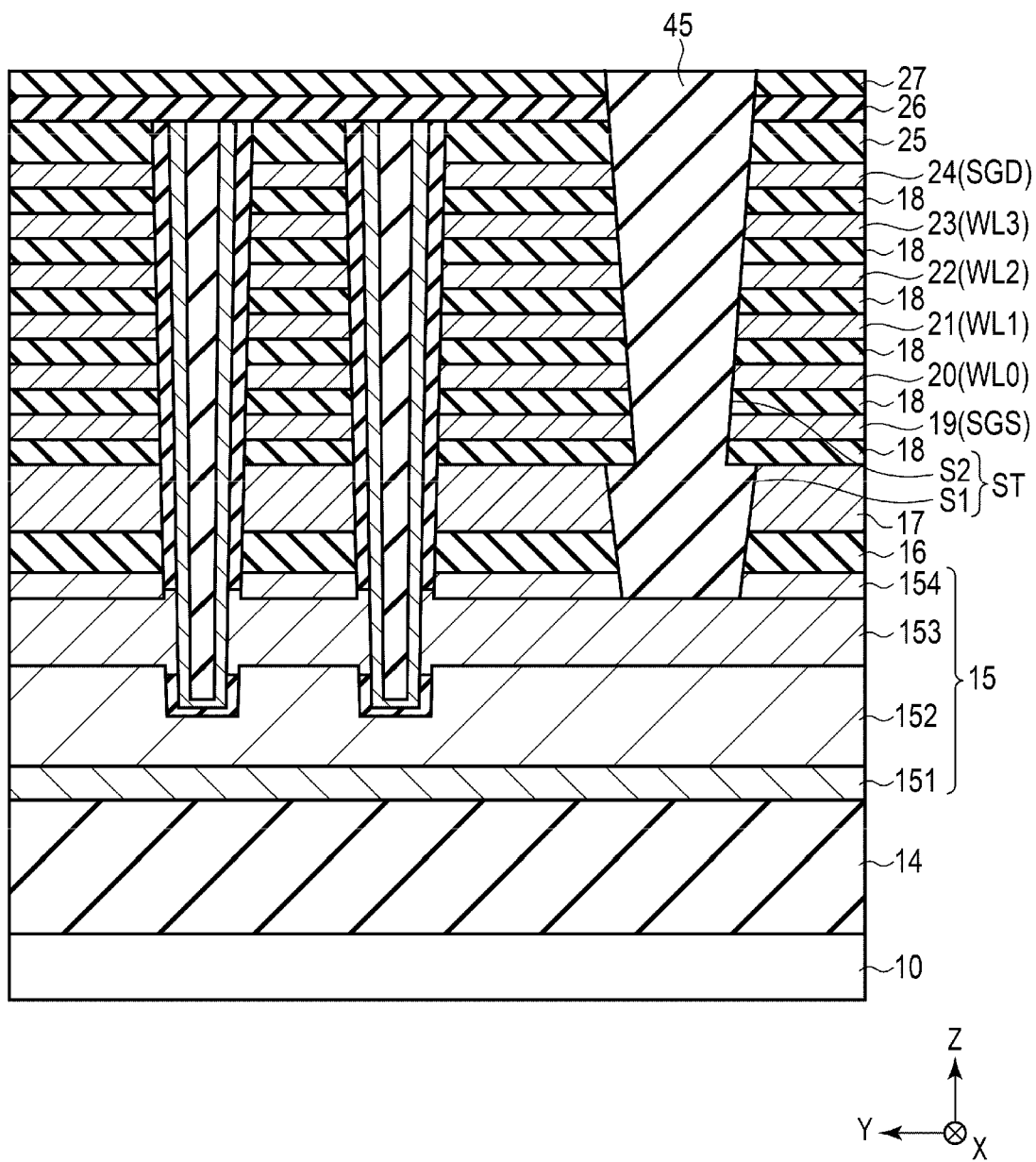
FIG. 5 is a cross-sectional view illustrating configurations of principal portions in the embodiment.

Configurations of principal portions in the semiconductor memory device in the embodiment will next be described with reference to FIG. 5. FIG. 5 is a cross-sectional view illustrating the configurations of the principal portions in the embodiment along the Y direction. For the sake of description, the slit ST and the memory pillars MP are shown in FIG. 5.

The peripheral circuit (not shown) having the CMOS circuits 11, interconnections, and the like is provided on the silicon substrate 10. The insulating layer 14 is provided on the silicon substrate 10 and the peripheral circuit. The insulating layer 14 includes, for example, a silicon oxide layer.

The conductive layer 15 is provided on the insulating layer 14. The conductive layer 15 functions as a source line SL. The conductive layer 15 is composed of a plurality of conductive layers 151, 152, 153, and 154. That is, the conductive layer 151 is provided on the insulating layer 14. The conductive layer 152 is provided on the conductive layer 151. The conductive layer 153 is provided on the conductive layer 152. Furthermore, the conductive layer 154 is provided on the conductive layer 153. The conductive layer 151 is a layer containing a metal, and configured with, for example, tungsten (W) or tungsten silicide. The conductive layers 152 and 153 include, for example, polycrystalline silicon layers to which impurities are added. Examples of the impurities include phosphorus (P) and arsenic (As). The conductive layer 154 includes, for example, a polycrystalline silicon layer to which no impurities are added. It is noted that the conductive layer 15 may be configured without the conductive layer 151.

The insulating layer 16 is provided on the conductive layer 154. The conductive layer 17 is provided on the insulating layer 16. The conductive layer 17 functions as a gate layer of the source-side select gate line SGS. Furthermore, the conductive layer 17 functions as an etch stop layer at the time of etching a plurality of stacked insulating layers during manufacturing of the device. The insulating layer 16 includes, for example, a silicon oxide layer. The conductive layer 17 is, for example, a polycrystalline silicon layer to which impurities are added. Examples of the impurities include phosphorus (P) and arsenic (As).

A plurality of insulating layers 18 and a plurality of conductive layers 19 to 24 are alternately stacked on the conductive layer 17. Further, the insulating layers 25, 26, and 27 are provided on the conductive layer 24. The insulating layers 18 and 25 to 27 include, for example, silicon oxide layers. The plurality of conductive layers 19 to 24 contain, for example, tungsten (W).

The memory pillars MP extend into the conductive layer 15 (source line SL), and through the plurality of insulating layers 16 and 18, the plurality of conductive layers 17 and 19 to 24, and the insulating layer 25. The memory pillars MP each have a columnar structure extending in the Z direction orthogonal to (or intersecting) a surface of the silicon substrate 10.

As shown in FIG. 3, the slits ST are provided between the memory blocks 101. The slits ST will be described with reference to FIG. 5. The slits ST extend into the conductive layer 15, and through the insulating layer 16, the conductive layers 17 and 19 to 24, and the insulating layers 18 and 25. The slits ST each have a plate-like structure extending in the X direction and the Z direction.

Each slit ST has a two-stage shape including a first shape S1 and a second shape S2 provided on the first shape S1. The first shape S1 is located in the conductive layer 154, the insulating layer 16, and the conductive layer 17 on the conductive layer 153. In a cross-section along the Y direction, the width of an upper surface of the first shape S1 is larger than that of a bottom surface (or lower surface) thereof. The second shape S2 is located in the insulating layer 18, the conductive layers 19 to 24, and the insulating layers 25 to 27 on the first shape S1. In the cross-section along the Y direction, the width of an upper surface of the second shape S2 is larger than that of a bottom surface thereof. Further, the width of the upper surface of the first shape S1 is larger than that of the bottom surface of the second shape S2.

A boundary between the first shape S1 and the second shape S2 is present between the conductive layer 15 (source line SL) and the conductive layer 19 (source-side select gate line SGS). More specifically, the boundary between the first shape S1 and the second shape S2 is present at the boundary between the conductive layer 17 and the insulating layer 18 (or therebetween).

The first shape S1 and the second shape S2 include, for example, an insulating layer 45 such as a silicon oxide layer.

1.2 Manufacturing Method for Semiconductor Memory Device

A manufacturing method for the semiconductor memory device shown in the embodiment will next be described with reference to FIGS. 6 to 18 and 5. FIGS. 6 to 18 are step cross-sectional views illustrating the manufacturing method for the semiconductor memory device.

Figure 6:
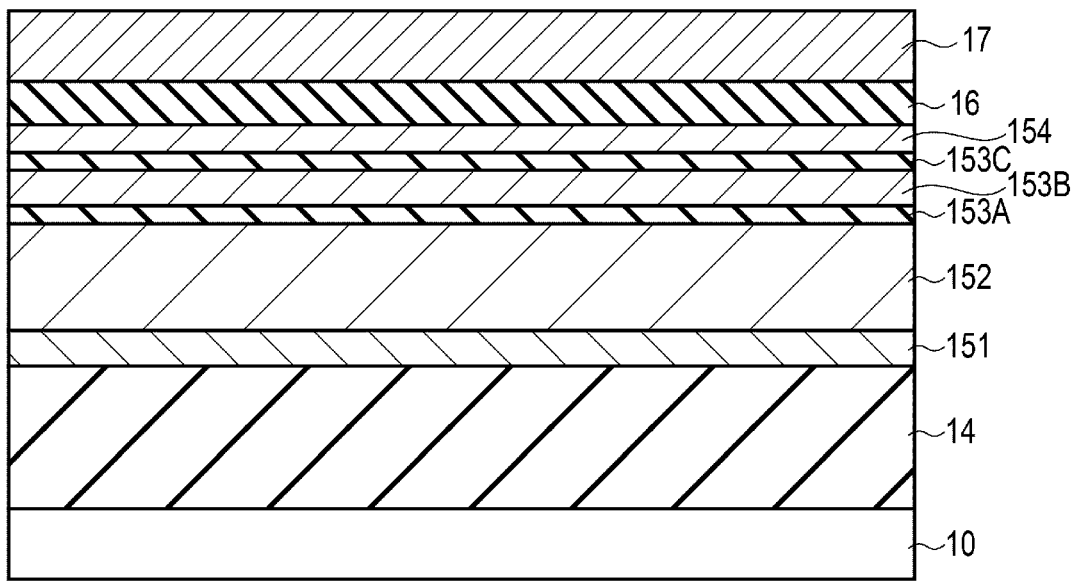
FIG. 6 is a cross-sectional view illustrating a manufacturing method for the semiconductor memory device in the embodiment.

As shown in FIG. 6, the peripheral circuit (not shown) having the CMOS circuits 11, the interconnections, and the like is formed on, for example, a silicon substrate 10. Further, the insulating layer (for example, silicon oxide layer) 14 is formed to cover the silicon substrate 10 and the peripheral circuit from above.

Next, the conductive layer (for example, a tungsten silicide layer) 151 is formed on the insulating layer 14. The conductive layer (for example, polycrystalline silicon layer) 152 is formed on the conductive layer 151.

Next, a protective layer 153A, a sacrificial layer 153B, and a protective layer 153C are formed on the conductive layer 152 in this order by a CVD (chemical vapor deposition) method. Further, the conductive layer (for example, polycrystalline silicon layer) 154 is formed on the protective layer 153C by the CVD method. The protective layers 153A and 153C include, for example, silicon oxide layers. The sacrificial layer 153B includes, for example, a polycrystalline silicon layer to which no impurities are added.

Next, the insulating layer (for example, a silicon oxide layer) 16 is formed on the conductive layer 154 by the CVD method. The conductive layer (for example, polycrystalline silicon layer) 17 is formed on the insulating layer 16 by the CVD method.

Figure 7:
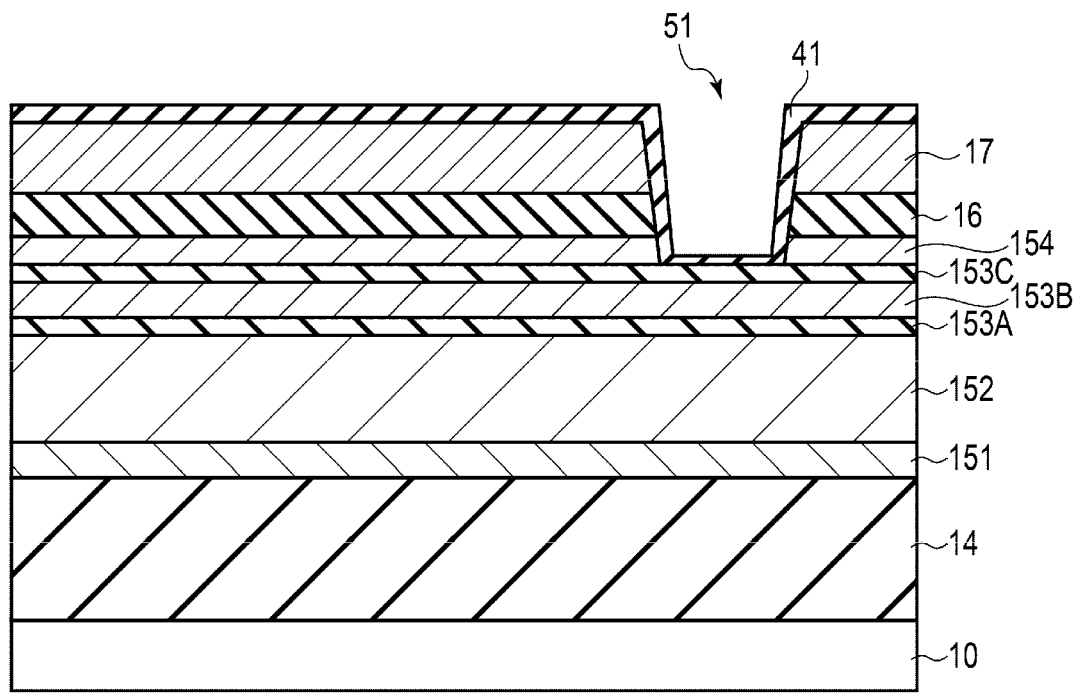
FIG. 7 is a cross-sectional view illustrating the manufacturing method for the semiconductor memory device in the embodiment.

Next, as shown in FIG. 7, grooves 51 for the lower portion of the slits are formed by an RIE (reactive ion etching) method. The slit grooves 51 are formed from an upper surface of the conductive layer 17 to the protective layer 153C. Next, an insulating layer 41 serving as a spacer is formed in each slit groove 51 by the CVD method. The insulating layer 41 includes, for example, a silicon nitride layer.

Figure 8:
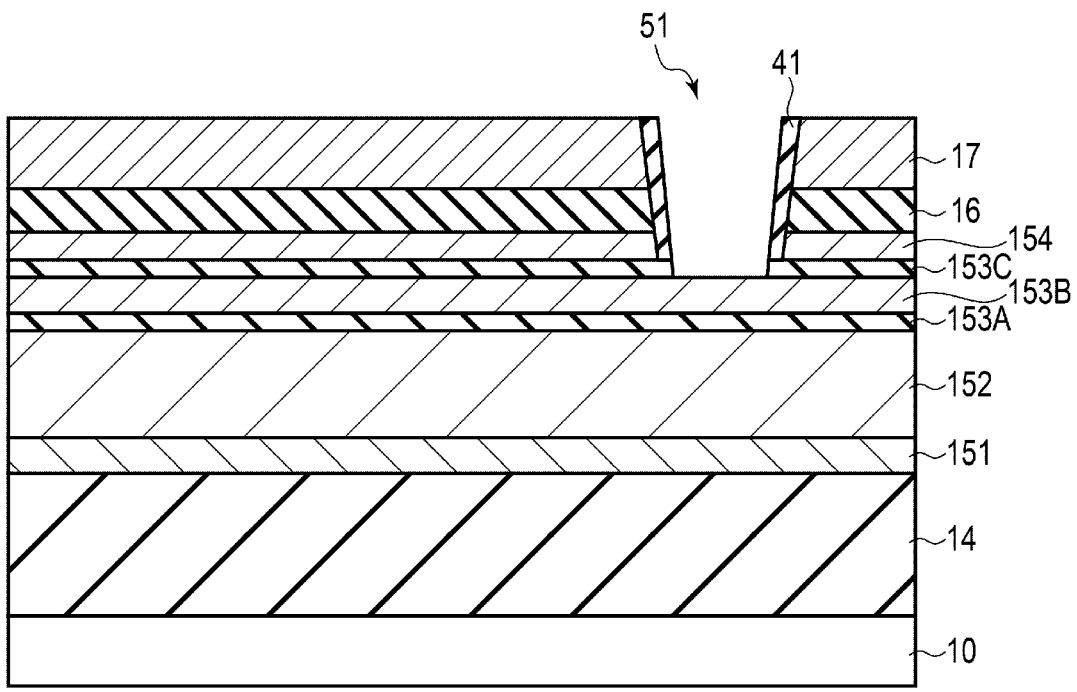
FIG. 8 is a cross-sectional view illustrating the manufacturing method for the semiconductor memory device in the embodiment.

Next, as shown in FIG. 8, the insulating layer 41 on a bottom surface of each slit groove 51 is removed by the RIE method. Furthermore, the protective layer 153C present on the bottom surface of the slit groove 51 is removed by the RIE method to expose the sacrificial layer 153B. At this time, the insulating layer 41 prevents side the surfaces of the slit groove 51 and the insulating layer 16 from being subjected to side-etching.

Figure 9:
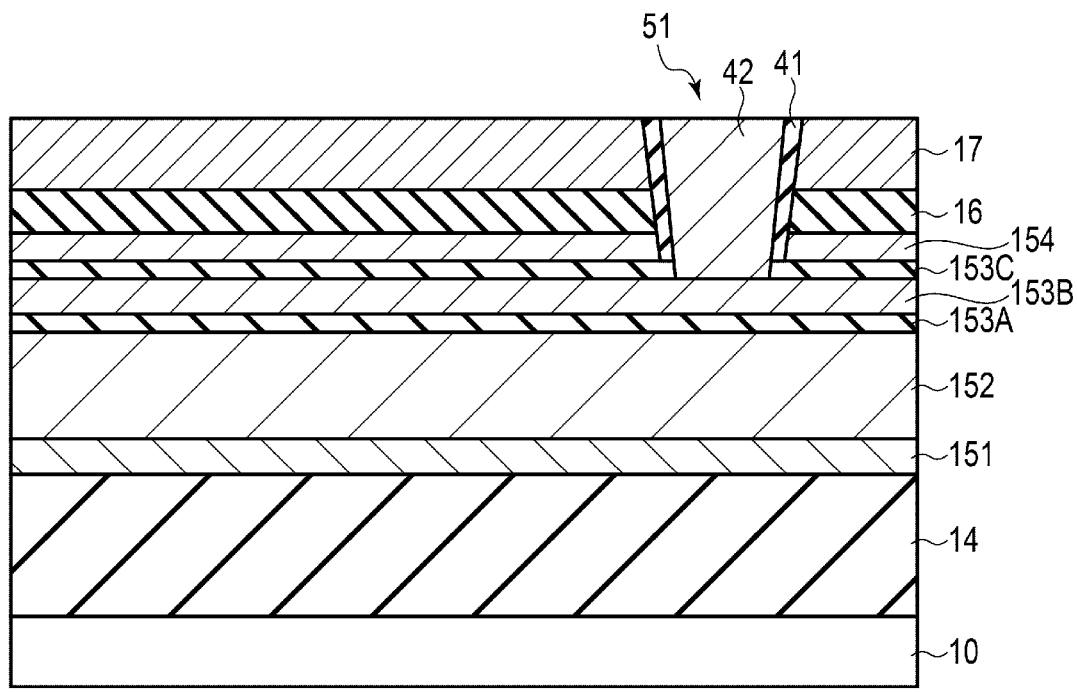
FIG. 9 is a cross-sectional view illustrating the manufacturing method for the semiconductor memory device in the embodiment.

Next, as shown in FIG. 9, an amorphous silicon layer (or polycrystalline silicon layer) 42, for example, is formed in each slit groove 51 by the CVD method. Subsequently, etch-back is performed to remove the excessive amorphous silicon layer on the slit groove 51 and the conductive layer 17.

Figure 10:
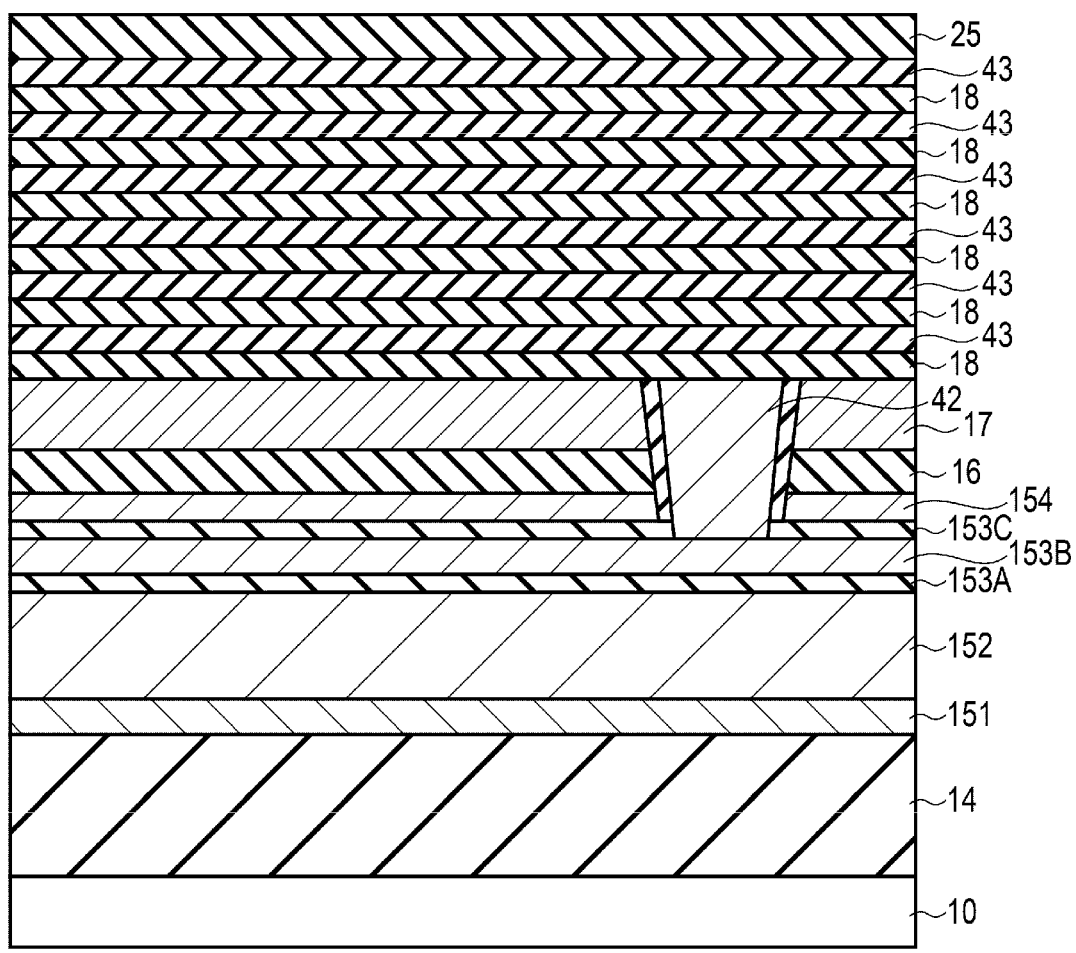
FIG. 10 is a cross-sectional view illustrating the manufacturing method for the semiconductor memory device in the embodiment.

Next, as shown in FIG. 10, a plurality of insulating layers (for example, silicon oxide layers) 18 and a plurality of insulating layers 43 are alternately formed on the conductive layer 17 and the amorphous silicon layer 42 by the CVD method. The insulating layers 43 include, for example, silicon nitride layers. In addition, the insulating layer (for example, a silicon oxide layer) 25 is formed on the uppermost insulating layer 43.

Figure 11:
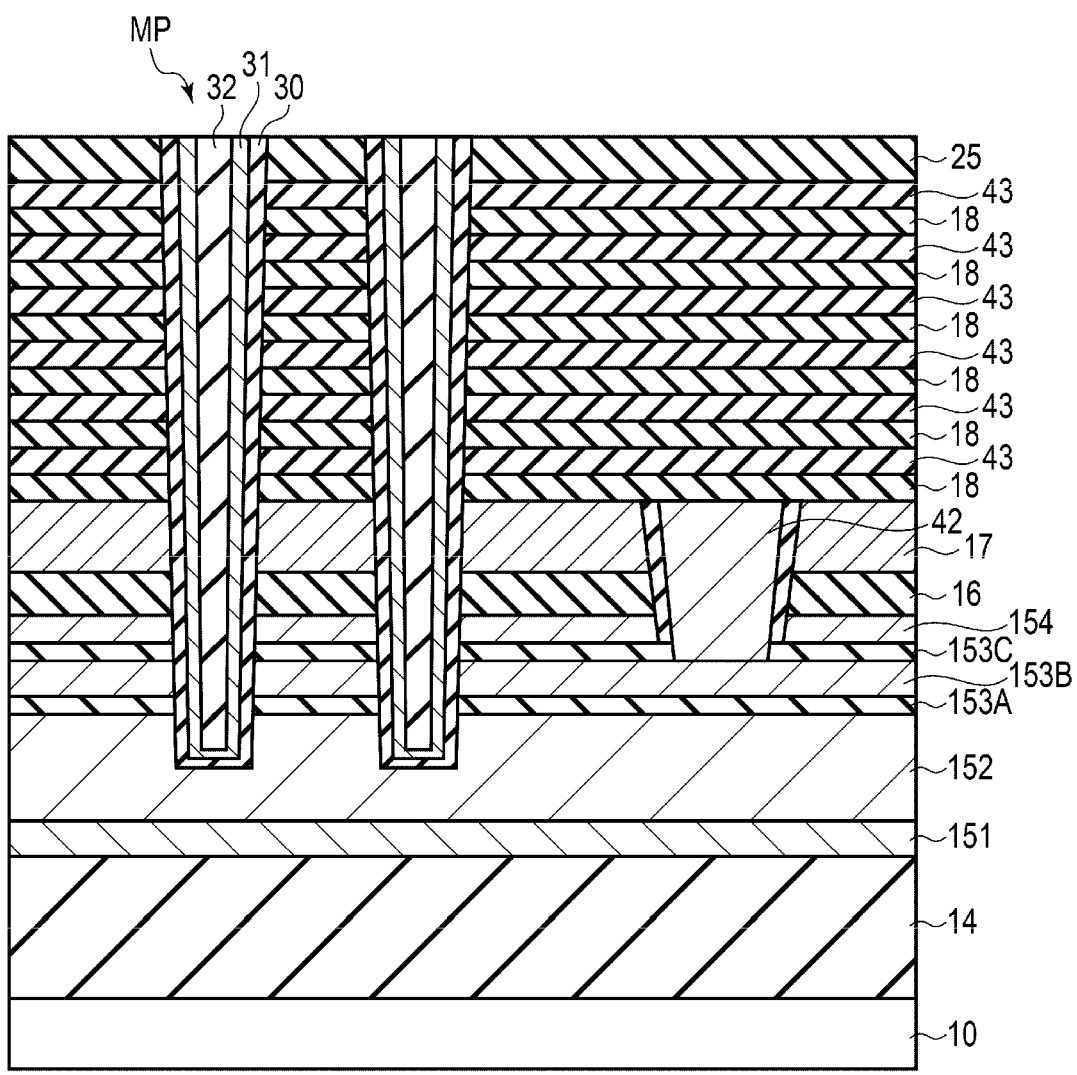
FIG. 11 is a cross-sectional view illustrating the manufacturing method for the semiconductor memory device in the embodiment.

Next, as shown in FIG. 11, the memory pillars MP are formed extending into the conductive layer 152, and through the protective layer 153A, the sacrificial layer 153B, the protective layer 153C, the conductive layer 154, the insulating layer 16, the conductive layer 17, the plurality of insulating layers 18, the plurality of insulating layers 43, and the insulating layer 25 on the conductive layer 151. The memory pillars MP extend from the upper surface of the insulating layer 25 to the conductive layer 152 in such a manner as to pass through these layers and into the conductive layer 152.

Specifically, the memory holes for forming the memory pillars MP are made by the RIE method. The memory holes are formed from the upper surface of the insulating layer 25 into the conductive layer 152. At this time, the conductive layer (for example, polycrystalline silicon layer) 17 functions as an etch stop layer at a time of etching the memory holes. That is, the conductive layer 17 temporarily stops etching on the memory holes and compensates for a variation in an etching rate among the plurality of memory holes. This can reduce a variation in positions of bottom surfaces of the memory holes. The cell insulating layer 30 is then formed on the inner wall of each memory hole. The semiconductor layer 31 is formed on the inner wall of the cell insulating layer 30. Further, the core insulating layer 32 is formed inside of the semiconductor layer 31.

Figure 12:
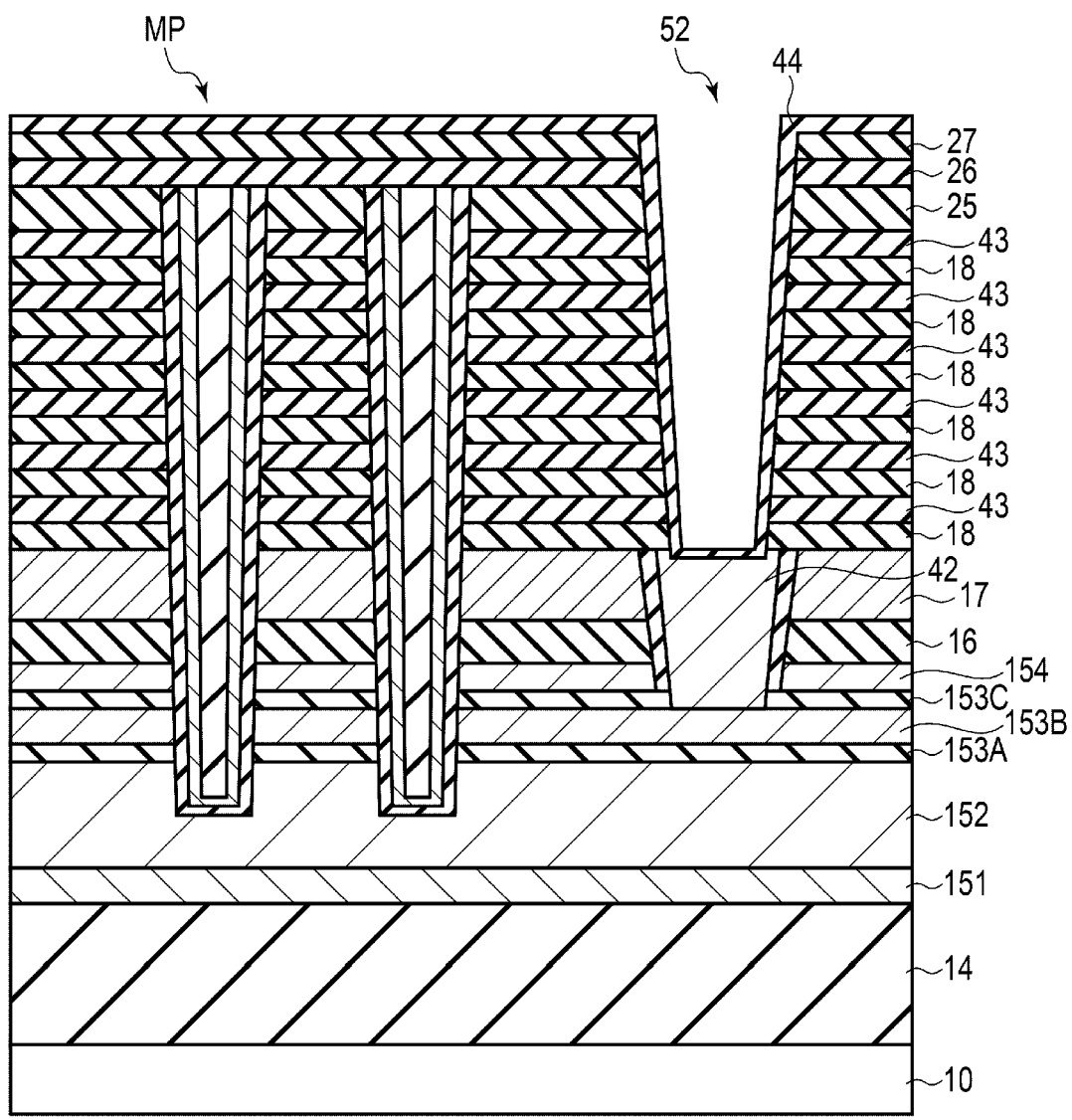
FIG. 12 is a cross-sectional view illustrating the manufacturing method for the semiconductor memory device in the embodiment.

Next, as shown in FIG. 12, the insulating layers (for example, silicon oxide layers) 26 and 27 are formed on the memory pillars MP and the insulating layer 25 by the CVMethod. Subsequently, stacked layers of the insulating layers 25 to 27, the insulating layer 18, and the insulating layer (for example, silicon nitride layer) 43 are etched by the RIE method, thereby forming grooves for the upper part of the slits. The slit grooves 52 are formed from an upper surface of the insulating layer 27 to the amorphous silicon layer 42. The amorphous silicon layer 42 at this time functions as an etch stop during the etching the slit grooves 52. That is, the amorphous silicon layer 42 temporarily stops etching the slit grooves 52 and compensates for a variation in an etching rate among the plurality of slit grooves 52. This can reduce a variation in positions of the bottom surfaces of the slit grooves 52. Subsequently, an insulating layer 44 serving as a spacer is formed on an inner wall of each slit groove 52 by the CVD method. The insulating layer 44 includes, for example, a silicon nitride layer.

Figure 13:
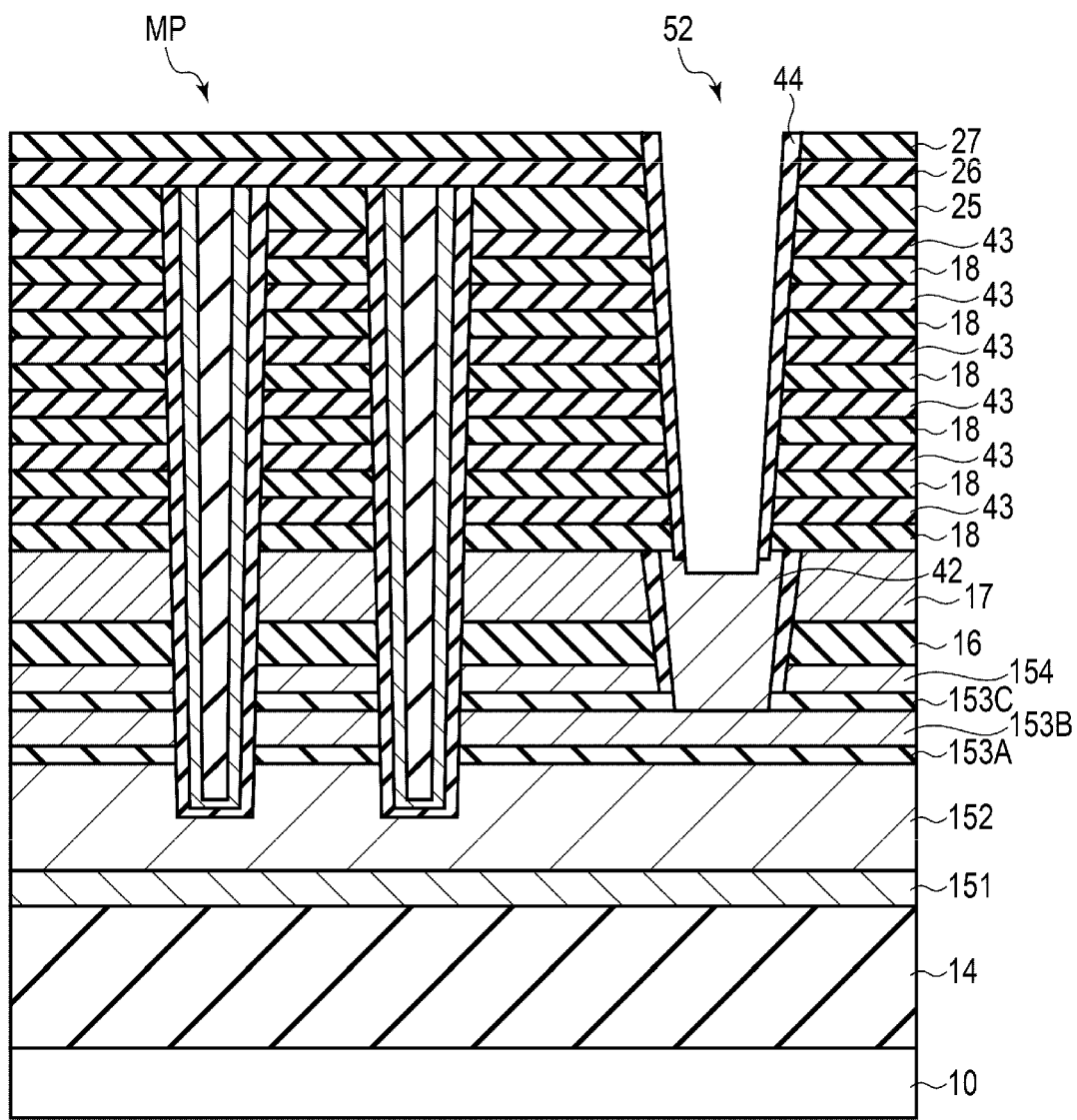
FIG. 13 is a cross-sectional view illustrating the manufacturing method for the semiconductor memory device in the embodiment.
Figure 14:
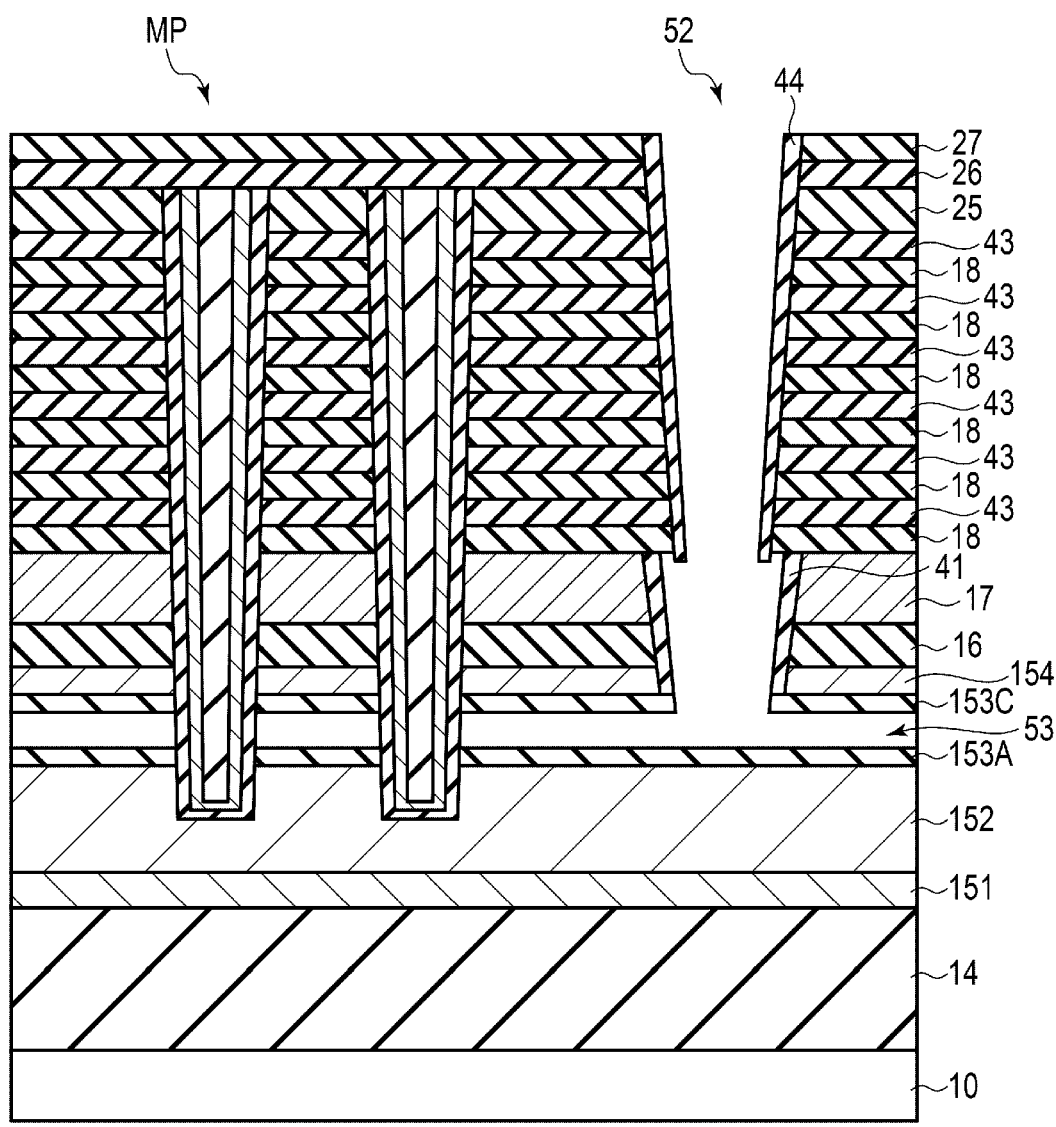
FIG. 14 is a cross-sectional view illustrating the manufacturing method for the semiconductor memory device in the embodiment.

Next, as shown in FIG. 13, the insulating layer 44 on a bottom surface of each slit groove 52 and over insulating layer 27 is removed by the RIE method to expose the amorphous silicon layer 42. Furthermore, as shown in FIG. 14, the amorphous silicon layer 42 in the slits and the sacrificial layer (for example, polycrystalline silicon layer) 153B between the protective layers 153A and 153C are removed via the slit grooves 52. For example, hot TMY (trimethyl(2-hydroxyethyl)ammonium hydroxide) is supplied via the slit grooves 52 to etch the amorphous silicon layer 42 and the sacrificial layer 153B.

As a result, as shown in FIG. 14, a cavity 53 is formed between the protective layers 153A and 153C. Furthermore, part of the cell insulating layer 30 of each memory pillar MP is exposed to the cavity 53 between the protective layers 153A and 153C. At this time, the insulating layer 41 prevents side surfaces of the conductive layers (for example, polycrystalline silicon layers) 17 and 154 at the sidewall of the slit grooves 52 from being etched. Moreover, the protective layers 153A and 153C protect the conductive layers 152 and 153 from being etched by the hot TMY.

Figure 15:
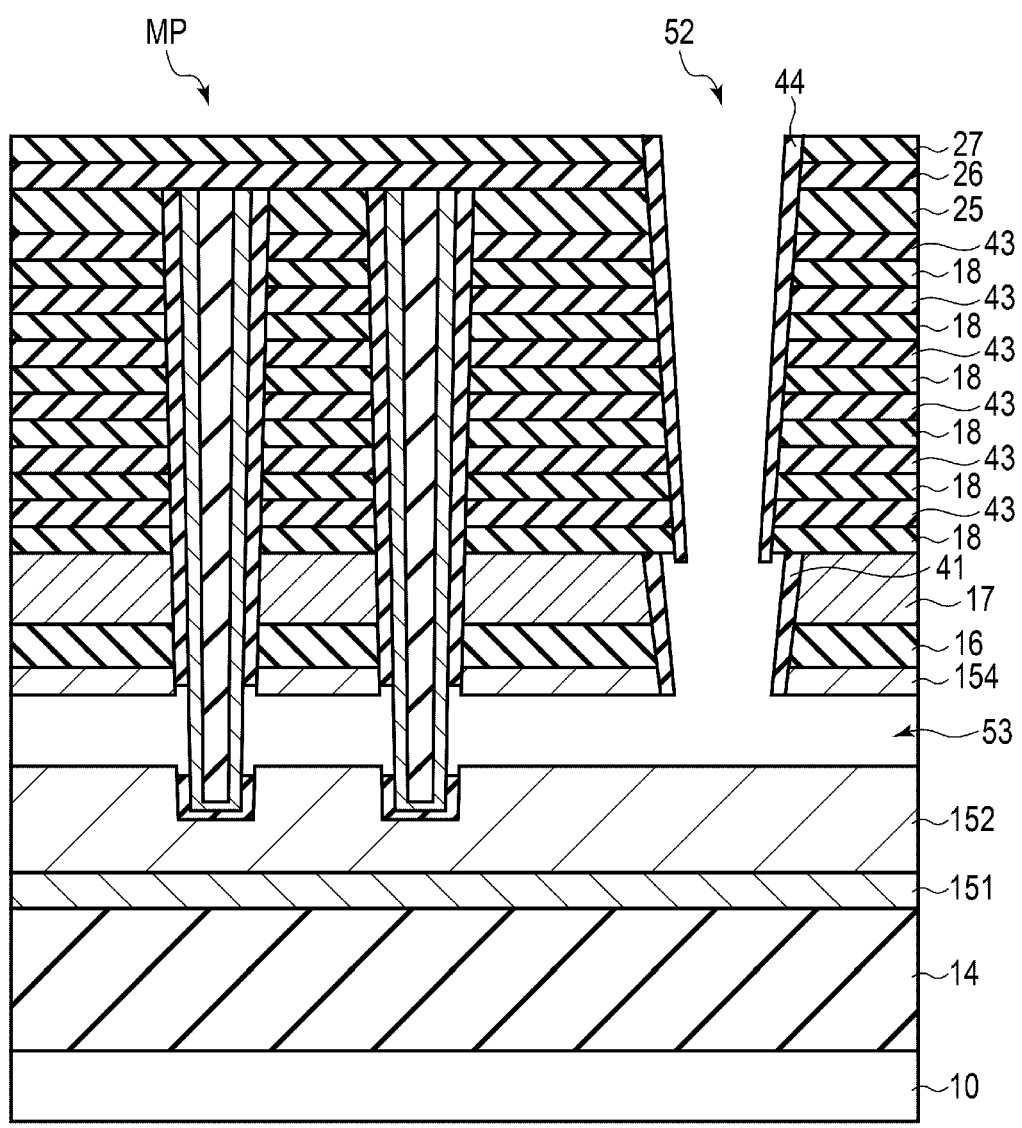
FIG. 15 is a cross-sectional view illustrating the manufacturing method for the semiconductor memory device in the embodiment.

Next, as shown in FIG. 15, part of the cell insulating layer 30 of each memory pillar MP and the protective layers (for example, silicon oxide layers) 153A and 153C are removed via the slit grooves 52. That is, part of the cell insulating layer 30 and the protective layers 153A and 153C are etched via the slit grooves 52 by, for example, a CDE (chemical dry etching) method. This expands the size of the cavity 53 between the conductive layers 152 and 154. It is noted that the insulating layers 41 and 44 present on the side surface of each slit groove 52 are silicon nitride layers similarly to the charge storage layer in the cell insulating layer 30. However, the insulating layers 41 and 44 remain on the inner wall of the slit groove 52 since the insulating layers 41 and 44 are deposited to a thickness thicker than the charge storage layer.

Figure 16:
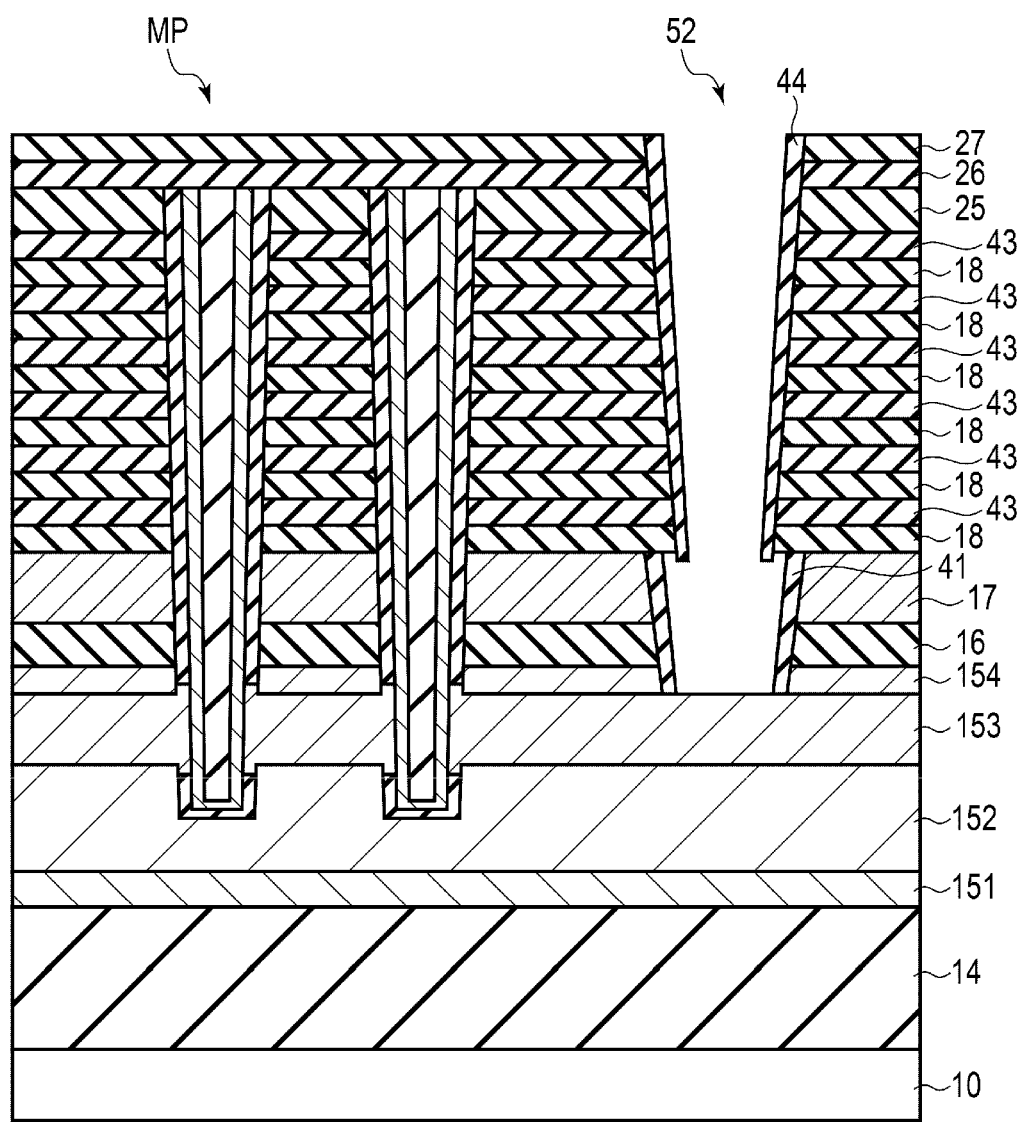
FIG. 16 is a cross-sectional view illustrating the manufacturing method for the semiconductor memory device in the embodiment.

Next, as shown in FIG. 16, the conductive layer 153 is formed in the cavity 53. For example, silicon-containing gas is supplied into the cavity 53 via the slit grooves 52, and silicon is epitaxially grown from an upper surface of the conductive layer 152, a lower surface of the conductive layer 154, and a side surface of the exposed semiconductor layer 31. The conductive layer 153 containing polycrystalline silicon is thereby formed in the cavity 53.

Figure 17:
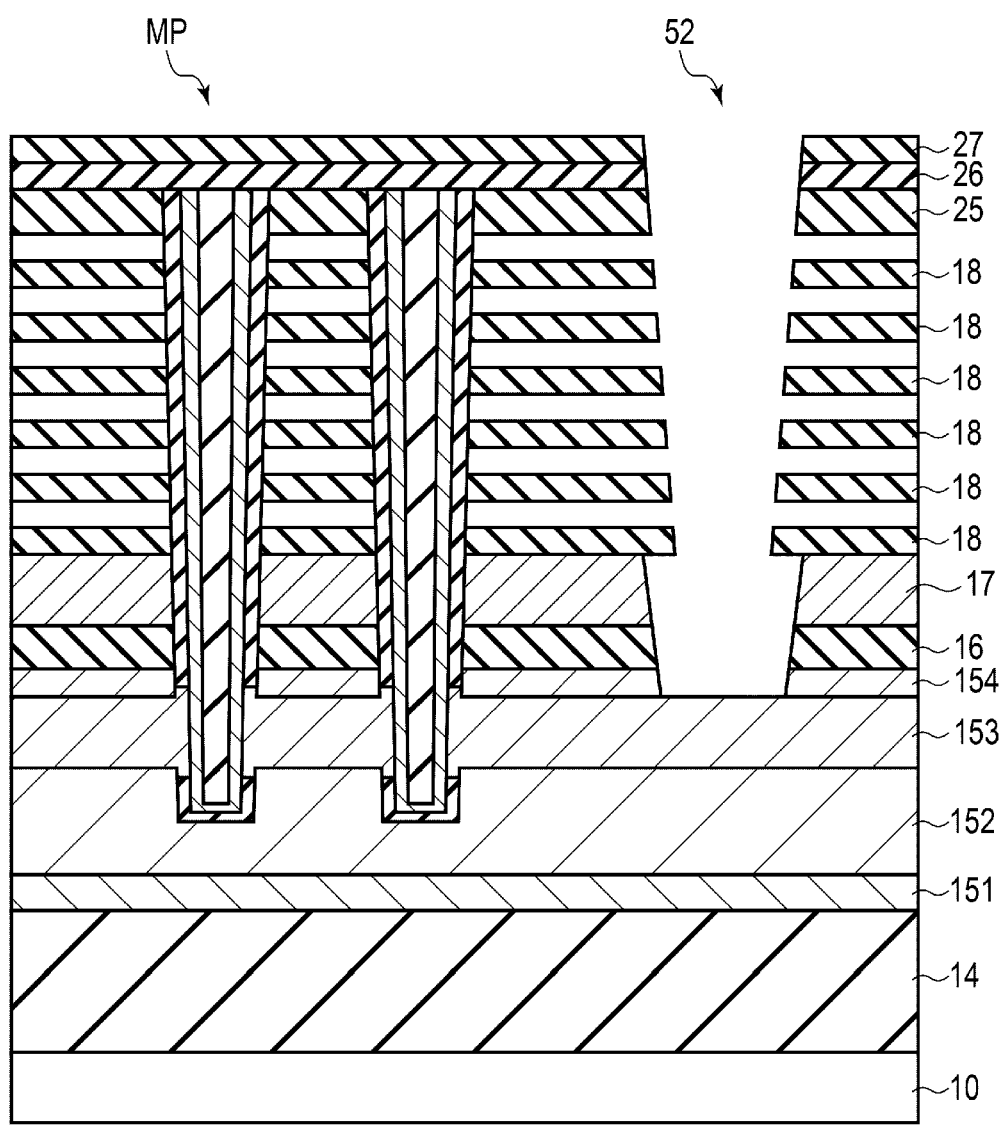
FIG. 17 is a cross-sectional view illustrating the manufacturing method for the semiconductor memory device in the embodiment.

Next, as shown in FIG. 17, the insulating layers 41 and 44 formed on the side surfaces of the slit grooves 52 are removed by wet etching. Further, the stacked insulating layers (for example, silicon nitride layers) 43 are removed. For example, a phosphoric acid solution is supplied via the slit grooves 52 to etch the insulating layers 41 and 44 in the slit grooves and the insulating layers 43. The insulating layers 43 are thereby removed; however, the insulating layers (for example, silicon oxide layers) 18 and 25 are not removed but remain. As a result, cavities are formed between the insulating layers 18 and between the insulating layers 18 and 25.

Figure 18:
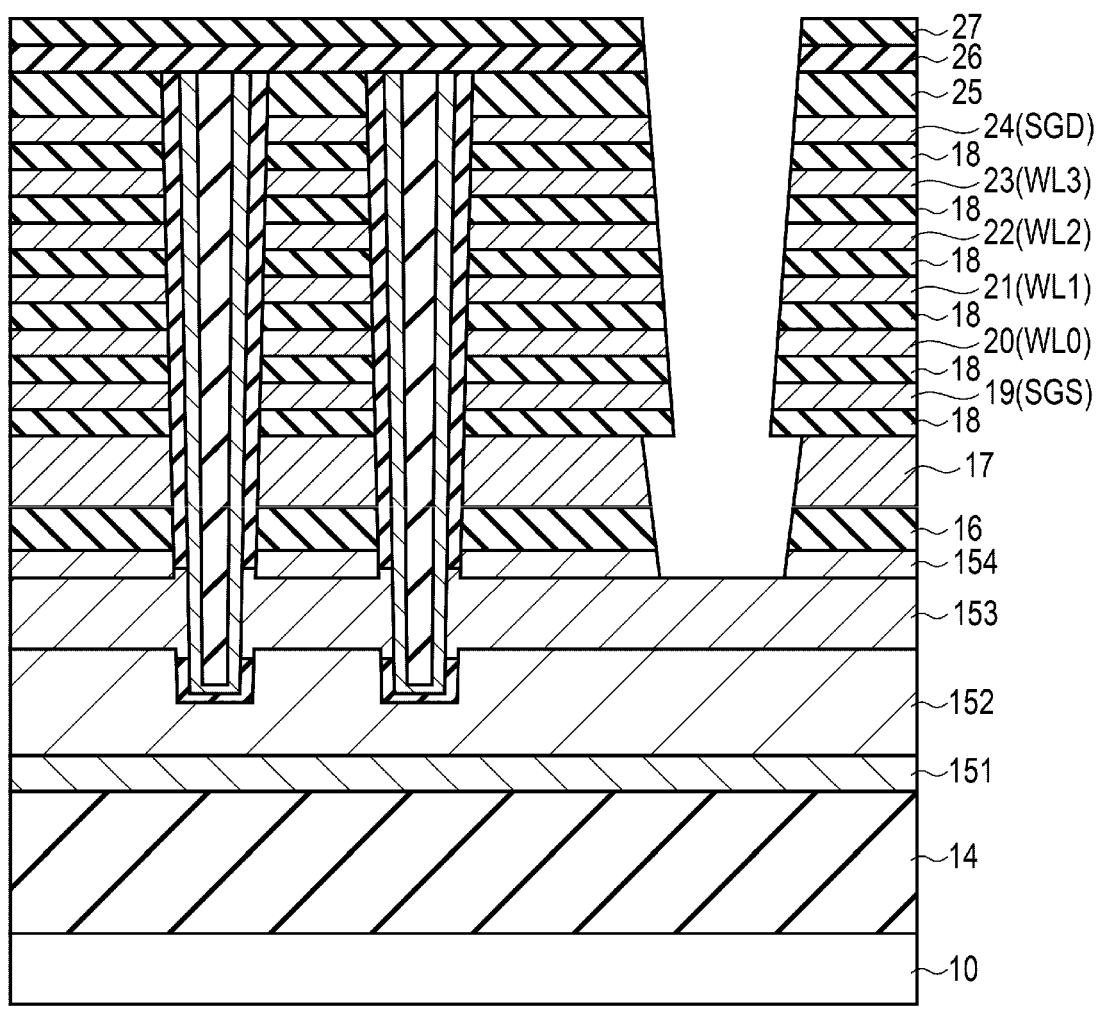
FIG. 18 is a cross-sectional view illustrating the manufacturing method for the semiconductor memory device in the embodiment.

Subsequently, as shown in FIG. 18, a conductive material, for example, tungsten is formed in the cavities between the insulating layers 18 and between the insulating layers 18 and 25 by the CVD method. The conductive layer 19 (source-side select gate line SGS), the conductive layers 20 to 23 (word lines WL0 to WL3), and the conductive layer 24 (drain-side select gate line SGD) are thereby formed.

Subsequently, as shown in FIG. 5, the insulating layer 45 is formed in each slit groove. The insulating layer 45 includes, for example, a silicon oxide layer. The slits ST are thereby formed.

The insulating layers, the contacts, the vias, the bit lines, and other necessary elements such as the interconnections are then formed, thus completing the manufacturing of the semiconductor memory device.

1.3 Effects of Embodiment

As described so far, in the embodiment, at a time of forming the slits ST that isolate the memory blocks (or word lines), the conductive layer (polycrystalline silicon layer) 17 having a high difficulty level in working is worked before stacking the plurality of insulating layers (silicon oxide layers) 18 and the insulating layers (silicon nitride layers) 43. More specifically, after forming the sacrificial layer 153B and the conductive layer 17 on the conductive layer 152, the conductive layer 17 is etched and the slit grooves 51 that reach the sacrificial layer 153B are formed to bury the amorphous silicon layer 42 in the slit grooves 51. Furthermore, the plurality of insulating layers 18 and the plurality of insulating layers 43 are alternately stacked on the conductive layer 17. Moreover, the insulating layers 18 and the insulating layers 43 on the amorphous silicon layer 42 are removed, and the slit grooves 52 that reach the amorphous silicon layer 42 are formed.

Through such steps, a depth of the slit grooves 52 may be such that the slit grooves 52 are stopped on the amorphous silicon layer 42, thereby facilitating forming the slit grooves. Moreover, both the amorphous silicon layer 42 and the sacrificial layer 153B present below the slit grooves 52 become silicon-containing layers, so that it is possible to etch the amorphous silicon layer 42 and the sacrificial layer 153B using similar etching gas.

This can facilitate controlling depths of the slit grooves and maintaining shapes of the slits to a desired position at desired positions, so that it is possible to lower the difficulty level in a slit forming step. As a result, it is possible to reduce a failure occurrence rate in the semiconductor memory device. It is also possible to improve reliability of the semiconductor memory device.

2. Modification

A semiconductor memory device in a modification of the embodiment will next be described. In the aforementioned embodiment, the boundary between the first shape S1 and the second shape S2 of each slit ST is located between the conductive layer 17 and the insulating layer 18. In the modification, the boundary between the first shape S1 and the second shape S2 is located between the insulating layer 18 on the conductive layer 17 and the conductive layer 19. Differences from the embodiment will be mainly described herein.

Figure 19:
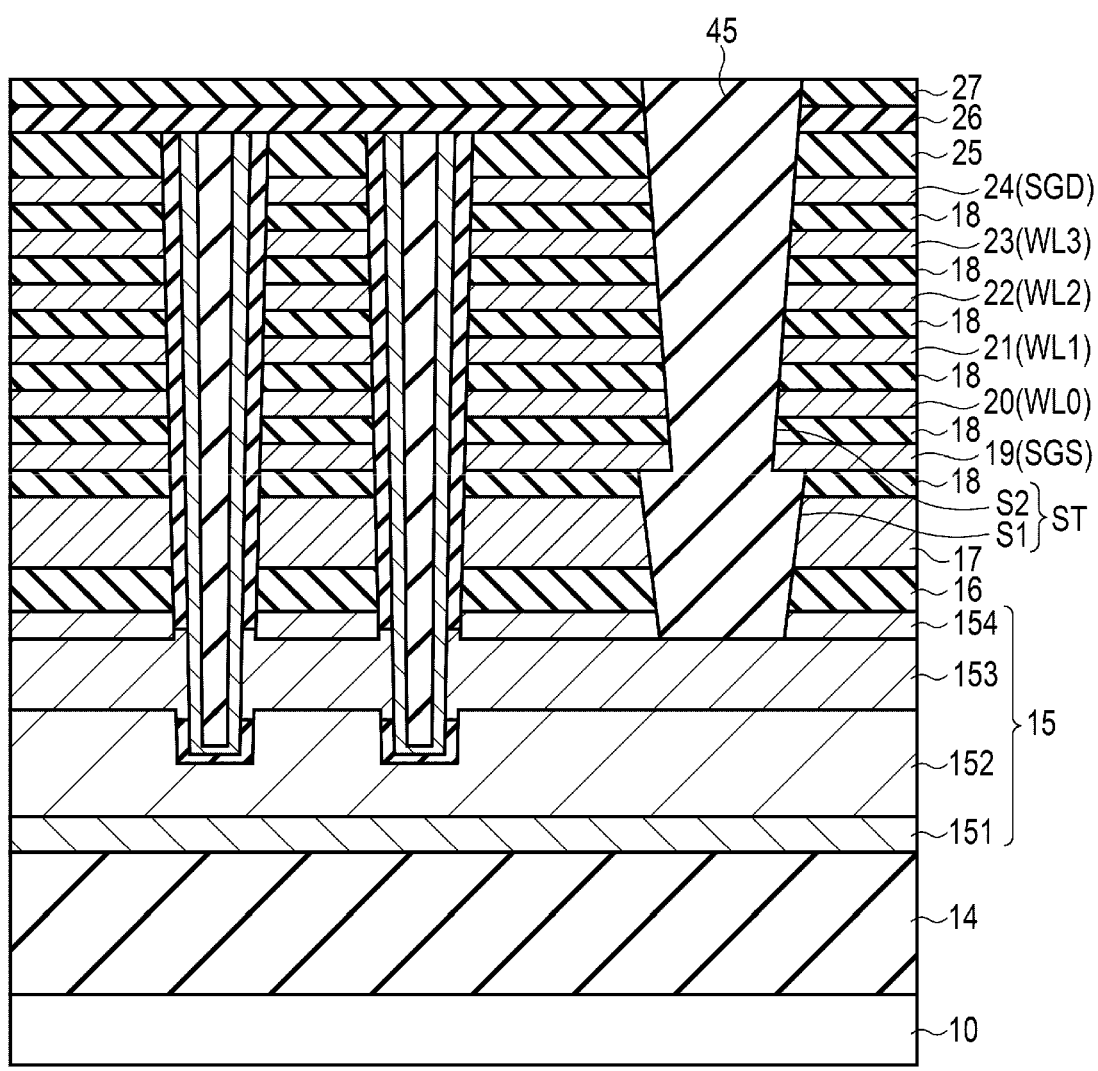
FIG. 19 is a cross-sectional view illustrating configurations of principal portions in a modification of the embodiment.

2.1 Configurations of Principal Portions and Manufacturing Method in Modification of Embodiment Configurations of principal portions in the semiconductor memory device in the modification of the embodiment will be described with reference to FIG. 19. FIG. 19 is a cross-sectional view illustrating the configurations of the principal portions in the modification along the Y direction. For the sake of description, the slit ST and the memory pillars MP are shown in FIG. 19.

As shown in FIG. 19, the slit ST has the two-stage shape including the first shape S1 and the second shape S2. In a cross-section along the Y direction, the boundary between the first shape S1 and the second shape S2 is present in a boundary between the insulating layer 18 adjoining the conductive layer 17 and the conductive layer 19 (or therebetween). The other configurations are similar to those in the embodiment described above.

As the manufacturing method, the insulating layers 18 are formed on the conductive layer 17 and then the slit grooves are formed in the modification while the conductive layer 17 is formed and then the slit grooves 51 are formed in the embodiment. The manufacturing method is similar to that of the first embodiment in other respects.

2.2 Effects of Modification

According to the modification, similarly to the embodiment described above, it is possible to reduce a failure occurrence rate in the semiconductor memory device. It is also possible to improve reliability of the semiconductor memory device.

Moreover, in the modification, when the protective layers (silicon oxide layers) 153A and 153C are etched after the polycrystalline silicon layers 42 and 153B are etched, it is possible to prevent the insulating layers (silicon oxide layers) 18 and the like from being influenced by etching gas. The other effects are similar to those of the embodiment described above.

3. Other Modifications and the Like

"Connected" In the embodiment include not only a case in which members are directly connected but also a case in which the members are connected via another member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first conductive layer;
a plurality of second conductive layers stacked above the first conductive layer in a first direction;
a third conductive layer disposed between the first conductive layer and a lowermost layer of the plurality of second conductive layers;
a pillar including a semiconductor layer and a charge storage layer provided between the semiconductor layer and the plurality of second conductive layers, the pillar extending through the plurality of second conductive layers and the third conductive layer in the first direction; and
a slit extending in the first direction and a second direction crossing the first direction, the slit separating the plurality of second conductive layers and the third conductive layer in a third direction crossing the first and second directions, the slit including a first portion penetrating the third conductive layer and being in contact with the first conductive layer and a second portion extending through and being in contact with the plurality of second conductive layers and being in contact with the first portion, wherein
the semiconductor layer of the pillar extends inside the first conductive layer, and a side surface of the semiconductor layer contacts the first conductive layer,
the first portion of the slit has a first width in the third direction at a location facing the third conductive layer,
the second portion of the slit has a second width in the third direction at a location facing a lowermost layer of the plurality of second conductive layers,
the semiconductor layer has a third width in the third direction at a location facing the third conductive layer, and
the first width is greater than the second width and the third width.

2. The semiconductor device according to claim 1, wherein the second portion of the slit has a greater length in the first direction than a length of the first portion of the slit in the first direction.

3. The semiconductor memory device according to claim 1, wherein the second portion of the slit contacts the first portion of the slit at a location between the first conductive layer and one of the plurality of second conductive layers that is closest to the first conductive layer.

4. The semiconductor memory device according to claim 1, wherein
a thickness of the third conductive layer in the first direction is greater than a thickness of at least one of the plurality of second conductive layers in the first direction, and
the semiconductor memory device further comprises a second insulating layer located on the third conductive layer.

5. The semiconductor memory device according to claim 1, wherein
a thickness of the third conductive layer in the first direction is greater than a thickness of at least one of the plurality of second conductive layers in the first direction,
the semiconductor memory device further comprises a second insulating layer located on the third conductive layer, and
the second portion of the slit contacts the first portion of the slit at a location adjoining the second insulating layer.

6. The semiconductor memory device according to claim 5, wherein a surface of the first portion of the slit facing the second portion extends along a surface of the third conductive layer facing the second insulating layer.

7. The semiconductor memory device according to claim 1, wherein
the pillar further includes a gate insulation layer and a charge storage layer, and
the first conductive layer is electrically connected to the semiconductor layer in the pillar.

8. The semiconductor memory device according to claim 1, wherein
the pillar further includes a gate insulation layer and a charge storage layer, and
adjacent portions of the plurality of second conductive layers, the gate insulation layer, the semiconductor layer, and the charge storage layer constitute memory cells.

9. The semiconductor memory device according to claim 1, wherein
the slit isolates adjacent portions of the plurality of second conductive layers in the third direction.

10. The semiconductor device according to claim 1, wherein the slit includes a conductive layer extending in the first direction and the second direction and a plurality of insulating layers on outer sides of the conductive layer in the third direction.

11. A method of manufacturing a semiconductor memory device, comprising:
forming a first conductive layer on a substrate;
forming a first sacrificial layer on the first conductive layer;
forming a second conductive layer on the first sacrificial layer;
removing a portion of the second conductive layer to form a first groove therethrough that reaches the first sacrificial layer;
forming a second sacrificial layer in the first groove;
alternately stacking a plurality of second insulating layers and a plurality of third insulating layers on the second conductive layer and the second sacrificial layer;
removing a portion of the second insulating layers and the third insulating layers to form a second groove that reaches the second sacrificial layer;
removing the second sacrificial layer and the first sacrificial layer via the second groove to form a cavity on the first conductive layer; and
forming a third conductive layer in the cavity.

12. The method according to claim 11, further comprising forming a third insulating layer on the sidewalls of the first groove before forming the second sacrificial layer in the first groove.

13. The method according to claim 12, further comprising forming a fourth insulating layer on the sidewalls of the second groove before removing the first and second sacrificial layers.

14. The method according to claim 13, further comprising:
removing the third and fourth insulating layers; and
removing the third insulating layers with an etchant via the second groove to form gaps between adjacent second insulating layers.

15. The method according to claim 14, further comprising forming a conductor in the gaps between adjacent second insulating layers.

16. The method according to claim 11, wherein the first groove is wider in a first direction of the surface of the substrate than an adjoining part of the second groove in the first direction.

17. The method according to claim 11, wherein a portion of the first groove extends along the substrate facing a side of the second insulating layer closest to the substrate.

* * * * *